(12) United States Patent
Lee et al.

(10) Patent No.: US 11,080,502 B2
(45) Date of Patent: Aug. 3, 2021

(54) DISPLAY DEVICE INCLUDING ULTRASONIC FINGERPRINT SENSOR

(71) Applicant: LG Display Co., Ltd., Seoul (KR)

(72) Inventors: Youngsoo Lee, Gyeongsangbuk-do (KR); NamYong Gong, Paju-si (KR); NamSeok Lee, Seoul (KR); Jinyeol Kim, Sangju-si (KR); SungPil Choi, Seoul (KR); HyunJun Min, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 102 days.

(21) Appl. No.: 16/563,126

(22) Filed: Sep. 6, 2019

(65) Prior Publication Data

US 2020/0134278 A1  Apr. 30, 2020

(30) Foreign Application Priority Data

Oct. 29, 2018  (KR) ........................ 10-2018-0130228

(51) Int. Cl.
| | |
|---|---|
| *H05K 1/18* | (2006.01) |
| *G06K 9/00* | (2006.01) |
| *G06F 1/16* | (2006.01) |
| *H05K 9/00* | (2006.01) |
| *G06F 1/20* | (2006.01) |
| *H05K 7/20* | (2006.01) |
| *H05K 1/02* | (2006.01) |

(52) U.S. Cl.
CPC ......... *G06K 9/0002* (2013.01); *G06F 1/1626* (2013.01); *G06F 1/1652* (2013.01); *G06F 1/1684* (2013.01); *G06F 1/203* (2013.01); *H05K 1/0278* (2013.01); *H05K 7/20454* (2013.01); *H05K 9/0054* (2013.01)

(58) Field of Classification Search
CPC .. G01S 7/52079; G06F 1/1605; G06F 1/1626; G06F 1/1652; G06F 1/1684; G06F 1/203; G06K 9/00912; G06K 9/0002; H01L 27/323; H05K 7/20454; H05K 9/0054
USPC .............................................................. 1/1
See application file for complete search history.

(56) References Cited

U.S. PATENT DOCUMENTS

| | | | | |
|---|---|---|---|---|
| 10,123,424 B1 * | 11/2018 | Lee | ........ | H05K 1/0278 |
| 2018/0082102 A1 * | 3/2018 | Lee | ........ | G06K 9/00912 |
| 2018/0307270 A1 * | 10/2018 | Pantel | ........ | G06F 1/1605 |
| 2018/0373913 A1 * | 12/2018 | Panchawagh | ........ | G01S 7/52079 |
| 2020/0065542 A1 * | 2/2020 | Jin | ........ | H01L 27/323 |

\* cited by examiner

*Primary Examiner* — Abdul-Samad A Adediran
(74) *Attorney, Agent, or Firm* — Fenwick & West LLP (57) ABSTRACT

A display device includes a flexible display panel, an ultrasonic fingerprint sensor which is disposed below a rear surface of an active area of the flexible display panel and has a first thickness and a first width, a cushion structure which is disposed below the rear surface of the flexible display panel, surrounds the periphery of the ultrasonic fingerprint sensor, and has a second thickness larger than the first thickness, and a circuit board which is electrically connected to the ultrasonic fingerprint sensor and has a second width larger than the first width.

18 Claims, 5 Drawing Sheets

DISPLAY DEVICE INCLUDING ULTRASONIC FINGERPRINT SENSOR

CROSS-REFERENCE TO RELATED APPLICATIONS

This application claims the priority of Republic of Korea Patent Application No. 10-2018-0130228 filed on Oct. 29, 2018, in the Korean Intellectual Property Office, the disclosure of which is incorporated herein by reference in its entirety.

BACKGROUND

Field

The present disclosure relates to a display device including an ultrasonic fingerprint sensor, and more particularly, to a display device including an ultrasonic fingerprint sensor overlapped in an active area.

Description of the Related Art

Recently, a display device including a fingerprint sensor capable of recognizing fingerprints has attracted attention. There is an advantage that the security function of the display device may be provided by recognizing the fingerprint of a user. However, there is a problem that the size of a bezel may be increased depending on a position of the fingerprint sensor in the display device. That is, when the fingerprint sensor is positioned in a non-active area, the size of the non-active area, that is, a bezel size cannot be reduced.

Fingerprint sensors have been developed using technologies such as a capacitive method, an optical method, and an ultrasonic method.

SUMMARY

The inventors of the present disclosure have recognized that various problems may occur in a display device when an ultrasonic fingerprint sensor is disposed below a rear surface of an active area of the display device.

The inventors of the present disclosure have intended to apply a cushion structure that absorbs physical shock or blocks heat to protect components of the display device. However, the inventors of the present disclosure have recognized that when the cushion structure is disposed between a display panel and the ultrasonic fingerprint sensor, there is a problem that a fingerprint recognition rate is lowered due to the signal deterioration of the ultrasonic fingerprint sensor.

The inventors of the present disclosure have recognized that a separation space may be generated between the cushion structure and the ultrasonic fingerprint sensor when a part of the cushion structure is removed and the ultrasonic fingerprint sensor is disposed at a position where the part of the cushion structure is removed. In this case, the inventors of the present disclosure have recognized that light and heat may be incident into the display device by the separation space between the cushion structure and the ultrasonic fingerprint sensor. The inventors of the present disclosure have recognized that damage to a flexible display panel may occur due to light and heat incident into the display device. Accordingly, the inventors of the present disclosure have recognized that the incidence of light and heat due to the separation space between the cushion structure and the ultrasonic fingerprint sensor should be minimized.

The inventors of the present disclosure have recognized that as the ultrasonic fingerprint sensor and the display panel are adjacent to each other, electromagnetic interference (EMI) generated in the ultrasonic fingerprint sensor may affect the display panel to deteriorate the quality of images displayed on the display panel. In addition, the inventors of the present disclosure have recognized that the EMI generated in the display panel may affect the ultrasonic fingerprint sensor to lower the fingerprint recognition rate.

The inventors of the present disclosure have intended to attach an ultrasonic fingerprint sensor to a flexible display panel formed of a flexible substrate and apply a cushion structure disposed around the fingerprint sensor. The inventors of the present disclosure have recognized that when the ultrasonic fingerprint sensor is bonded to the flexible display panel, the display panel may be pressed and the display panel may be deformed. That is, the inventors of the present disclosure have recognized that due to the flexible characteristics of the display panel, pressure, stress, and the like generated during the bonding process between the display panel and the ultrasonic fingerprint sensor cause deformation of the flexible display panel.

Therefore, an object to be achieved by the present disclosure is to provide a display device in which a part of a cushion structure is removed and an ultrasonic fingerprint sensor is disposed at a position where the part of the cushion structure is removed, so that the ultrasonic fingerprint sensor may be disposed in an active area and an area of a non-active area may be minimized.

Another object to be achieved by the present disclosure is to provide a display device in which a layer capable of blocking light and heat is included between an ultrasonic fingerprint sensor and a flexible display panel to minimize damage to the flexible display panel.

Yet another object to be achieved by the present disclosure is to provide a display device in which a metal layer is disposed between an ultrasonic fingerprint sensor and a flexible display panel to block interference between a signal generated from the flexible display panel and a signal generated from the ultrasonic fingerprint sensor.

Still another object to be achieved by the present disclosure is to provide a display device in which when an ultrasonic fingerprint sensor is disposed below a rear surface of a flexible display panel, a flexible characteristic of the display panel is considered to minimize deformation of the flexible display panel.

Still yet another object to be achieved by the present disclosure is to provide a display device in which an adhesive layer having a Young's modulus suitable for the characteristics of an ultrasonic fingerprint sensor is disposed to improve the sensing performance of the ultrasonic fingerprint sensor.

Objects of the present disclosure are not limited to the above-mentioned objects, and other objects, which are not mentioned above, can be clearly understood by those skilled in the art from the following descriptions.

According to an aspect of the present disclosure, the display device may include: a flexible display panel; an ultrasonic fingerprint sensor which is disposed below a rear surface of an active area of the flexible display panel and has a first thickness and a first width; a cushion structure which is disposed below the rear surface of the flexible display panel, surrounds the periphery of the ultrasonic fingerprint sensor, and has a second thickness larger than the first thickness; and a circuit board which is electrically connected to the ultrasonic fingerprint sensor and has a second width larger than the first width.

According to an aspect of the present disclosure, a thickness of the ultrasonic fingerprint sensor may be smaller than a thickness of the cushion structure in order to minimize deformation of the flexible display panel.

According to an aspect of the present disclosure, the ultrasonic fingerprint sensor may be spaced apart from the rear surface of the flexible display panel by a predetermined distance.

According to another aspect of the present disclosure, an area of the circuit board may be larger than an area of the ultrasonic fingerprint sensor.

According to another aspect of the present disclosure, the circuit board may be configured to be supported by the cushion structure, and the ultrasonic fingerprint sensor is fixed to the circuit board.

According to another aspect of the present disclosure, the cushion structure may include at least one of a black layer, a shock absorbing layer, and a heat dissipation layer.

According to another aspect of the present disclosure, the display device may further include a thermosetting adhesive layer disposed between the ultrasonic fingerprint sensor and the flexible display panel.

According to another aspect of the present disclosure, a thickness of the thermosetting adhesive layer may be at least 3 µm or more after heat curing.

According to another aspect of the present disclosure, the display device may further include a black layer disposed between the flexible display panel and the ultrasonic fingerprint sensor.

According to another aspect of the present disclosure, the cushion structure may be configured to include an opening area in which the ultrasonic fingerprint sensor is disposed, and the cushion structure may be configured to reduce visible light incident to the rear surface of the flexible display panel through the opening area.

According to another aspect of the present disclosure, the circuit board supported by the cushion structure may be configured to cover the opening area, and the circuit board may be configured to reduce visible light incident to the rear surface of the flexible display panel through the opening area.

According to another aspect of the present disclosure, the cushion structure may include a thermosetting adhesive layer and a shock absorbing layer disposed below the rear surface of the thermosetting adhesive layer, the shock absorbing layer may include an opening area configured in which the ultrasonic fingerprint sensor is disposed, and the thermosetting adhesive layer may overlap with the shock absorbing layer and be disposed in the opening area to adhere the ultrasonic fingerprint sensor.

According to another aspect of the present disclosure, the cushion structure may include a heat dissipation layer, and the heat dissipation layer may contact with the circuit board.

According to another aspect of the present disclosure, the heat dissipation layer may be electrically connected to at least a part of the circuit board.

According to another aspect of the present disclosure, the heat dissipation layer may be electrically grounded.

According to another aspect of the present disclosure, the display device may further include a shielding layer disposed between the cushion structure and the ultrasonic fingerprint sensor and the flexible display panel and configured to block interference between a signal generated from the flexible display panel and a signal generated from the ultrasonic fingerprint sensor.

According to another aspect of the present disclosure, the shielding layer may be electrically connected to the heat dissipation layer.

According to exemplary embodiments of the present disclosure, the display device may include a flexible display panel including an active area including a first area and a second area excluding the first area and a non-active area; an ultrasonic fingerprint sensor disposed in the first area below the flexible display panel, and a cushion structure disposed in the second area below the flexible display panel and including at least one of a black layer, a shock absorbing layer, and a heat dissipation layer.

According to another aspect of the present disclosure, the display device may further include a circuit board configured to fix the ultrasonic fingerprint sensor and supported by the cushion structure.

According to another aspect of the present disclosure, the circuit board may be configured to shield the first area.

Other detailed matters of the exemplary embodiments are included in the detailed description and the drawings.

According to the present disclosure, a layer capable of blocking light and heat is disposed between an ultrasonic fingerprint sensor and a flexible display panel to reduce damage to the flexible display panel.

Further, according to the present disclosure, a metal layer is disposed between an ultrasonic fingerprint sensor and a flexible display panel to block interference between a signal generated from the flexible display panel and a signal generated from the ultrasonic fingerprint sensor.

Further, according to the present disclosure, an adhesive layer having a Young's modulus capable of improving ultrasonic transmission characteristics is disposed on the ultrasonic fingerprint sensor, so that ultrasonic waves generated from the ultrasonic fingerprint sensor are easily transmitted from each layer of the display device.

According to the exemplary embodiments of the present disclosure, a part of a cushion structure is removed and an ultrasonic fingerprint sensor is disposed at a position where the part of the cushion structure is removed, so that the ultrasonic fingerprint sensor may be disposed in an active area and an area of a non-active area may be minimized.

According to the exemplary embodiments of the present disclosure, a layer capable of blocking light and heat is provided between an ultrasonic fingerprint sensor and a flexible display panel to minimize damage to the flexible display panel.

According to the exemplary embodiments of the present disclosure, a metal layer is disposed between an ultrasonic fingerprint sensor and a flexible display panel to block interference between a signal generated from the flexible display panel and a signal generated from the ultrasonic fingerprint sensor.

According to the exemplary embodiments of the present disclosure, when an ultrasonic fingerprint sensor is disposed below a rear surface of a flexible display panel, a flexible characteristic of the display panel is considered to minimize deformation of the flexible display panel.

According to the exemplary embodiments of the present disclosure, an adhesive layer having a Young's modulus suitable for the characteristics of an ultrasonic fingerprint sensor is disposed to improve the sensing performance of the ultrasonic fingerprint sensor.

Embodiments also relate to a display device including a flexible display panel including an active area for emitting light, an ultrasonic fingerprint sensor disposed below the active area of the flexible display panel. The ultrasonic fingerprint sensor may be spaced apart from a rear surface of the flexible display panel in a first direction. The display device may also include a cushion structure disposed below the flexible display panel, and disposed adjacent the ultrasonic fingerprint sensor in a second direction different from the first direction, and a circuit board electrically connected to the ultrasonic fingerprint sensor.

Embodiments also relate to a display device including a flexible display panel including an active area for emitting light, an ultrasonic fingerprint sensor disposed below the active area of the flexible display panel, a cushion structure disposed below the flexible display panel in a first direction, and disposed adjacent the ultrasonic fingerprint sensor in a second direction different from the first direction, and a circuit board electrically connected to the ultrasonic fingerprint sensor.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, the element or layer may be disposed directly on the another element or layer, or other layer or other element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 1A:
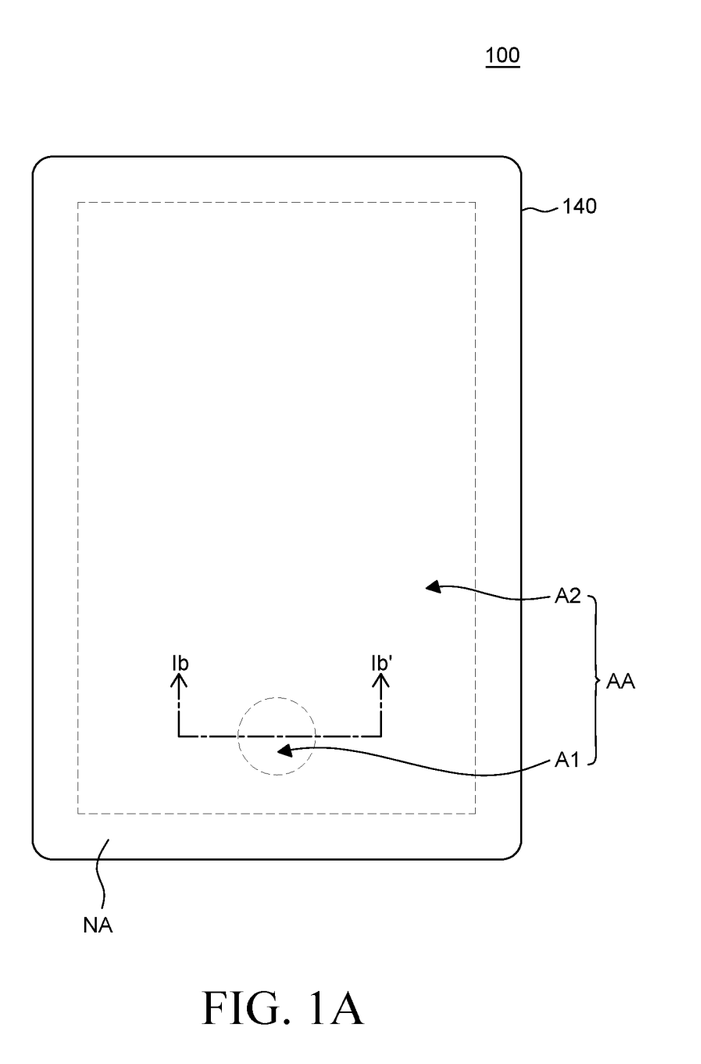
FIG. 1A is a plan view of a display device according to an exemplary embodiment of the present disclosure.
Figure 1B:
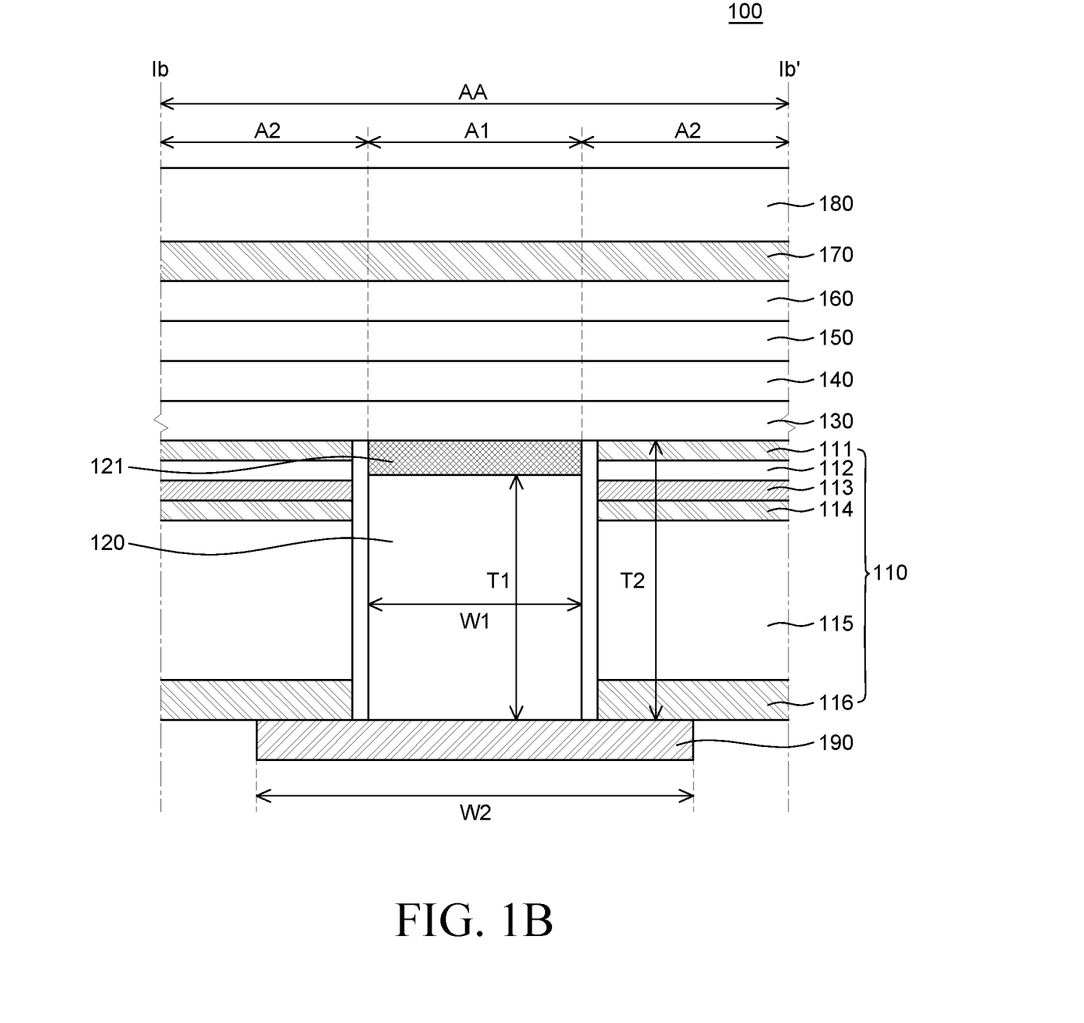
FIG. 1B is a cross-sectional view of Ib-Ib' of FIG. 1A, according to an embodiment of the present disclosure.

FIG. 1A is a plan view of a display device according to an exemplary embodiment of the present disclosure. FIG. 1B is a cross-sectional view of Ib-Ib' of FIG. 1A according to an embodiment of the present disclosure.

Referring to FIG. 1A, a display device 100 includes a flexible display panel 140. The flexible display panel 140 includes a display element used for displaying images, various driving elements for driving the display element, lines and the like. Hereinafter, a case where the flexible display panel 140 is an electroluminescent flexible display panel including an electroluminescence display element is described as an example, but the present disclosure is not limited thereto. The flexible display panel 140 includes an active area AA and a non-active area NA.

The active area AA is an area where an image is displayed in the display device 100, and a display element and various driving elements for driving the display element are disposed in the active area AA. Thus, the active area AA of the flexible display panel may be an area for emitting light to display an image. The active area AA includes a first area A1 and a second area A2 excluding the first area A1.

The non-active area NA is an area adjacent to the active area AA. The non-active area NA is an area where no image is displayed, and lines or a circuit unit is formed in the non-active area NA.

Referring to FIG. 1B, a back plate 130 may be disposed below the flexible display panel 140. The back plate 130 is a substrate for supporting and protecting the flexible display panel 140. The back plate 130 may be made of a plastic material. When the back plate 130 is made of a plastic material, the back plate 130 may be made of, for example, polyethylene terephthalate (PET). However, the present disclosure is not limited thereto.

A cushion structure 110 may be disposed below the display panel 140, for example, in the second area A2 below the back plate 130. The cushion structure 110 is a structure that protects the components of the display device 100 by absorbing physical shock or blocking heat. Specifically, the cushion structure 110 may optionally include at least some of a first adhesive layer 111, a support layer 112, a black layer 113, a second adhesive layer 114, a shock absorbing layer 115, and a heat dissipation layer 116.

The cushion structure 110 may be disposed in the second area A2 below the back plate 130. The cushion structure 110 is a structure that protects components of the display device 100 by absorbing physical shock or blocking heat. Specifically, the cushion structure 110 may be configured to include the first adhesive layer 111, the support layer 112, the black layer 113, the second adhesive layer 114, the shock absorbing layer 115, and the heat dissipation layer 116, which are sequentially stacked from the flexible display panel 140.

The first adhesive layer 111 may be disposed in the second area A2 below the back plate 130. The first adhesive layer 111 is an adhesive layer disposed between a support layer 112 and the back plate 130 to adhere the cushion structure 110 to the back plate 130. The first adhesive layer 111 may be transparent and may have a thickness of, for example, 7 μm to 15 μm. The first adhesive layer 111 may be made of an optically clear adhesive (OCA), a pressure sensitive adhesive (PSA), or a thermosetting material. However, the present disclosure is not limited thereto.

The thermosetting material constituting the first adhesive layer 111 is disposed between the cushion structure 110 and the display panel 140 to be cured by heat so that the cushion structure 110 may be attached to the display panel 140. A curing temperature of the thermosetting material constituting the first adhesive layer 111 may be lower than a temperature at which the flexible display panel 140 is damaged.

The support layer 112 may be disposed below the first adhesive layer 111. The support layer 112 is a layer for supporting the black layer 113. The support layer 112 may be formed of a plastic material, for example, polyethylene terephthalate (PET). However, the present disclosure is not limited thereto. The support layer 112 may have a thickness of, for example, 3 μm to 6 μm.

The black layer 113 may be disposed below the support layer 112. The black layer 113 is an opaque layer capable of blocking visible light. The black layer 113 may be composed of a black dye or pigment. The black layer 113 may be formed on the support layer 112 and the support layer 112 and the black layer 113 may be attached to the first adhesive layer 111. The black layer 113 may have a thickness of, for example, 0.5 μm to 5 μm.

The second adhesive layer 114 may be disposed below the black layer 113. The second adhesive layer 114 is an adhesive layer that adheres the black layer 113 and the shock absorbing layer 115 to each other. The second adhesive layer 114 may be made of the same material as the first adhesive layer 111. The second adhesive layer 114 may be transparent and may have a thickness of, for example, 5 μm to 12 μm.

The shock absorbing layer 115 may be disposed below the second adhesive layer 114. The shock absorbing layer 115 is a layer that absorbs physical shock. Specifically, the shock absorbing layer 115 may include a plurality of bubbles, and the plurality of bubbles may effectively absorb the physical shock applied to the display device 100. The shock absorbing layer 115 may be made of an acrylic foam, but is not limited thereto. The shock absorbing layer 115 may be opaque and may have a thickness of, for example, 50 μm to 120 μm.

The heat dissipation layer 116 may be disposed below the shock absorbing layer 115. The heat dissipation layer 116 is a layer that dissipates heat from the cushion structure 110. Specifically, the heat dissipation layer 116 is a layer that reduces temperature rising by dissipating heat from the lower portion of the display device 100. The heat dissipation layer 116 may be made of a metal material and may include, for example, copper (Cu), and the heat dissipation layer 116 may have a thickness of, for example, 30 μm to 70 μm.

When the heat dissipation layer 116 is provided, a circuit board 190 may be configured to contact with a rear surface of the heat dissipation layer 116. When the heat dissipation layer 116 is made of a conductive material, the heat dissipation layer 116 may be electrically connected to a part of the circuit board 190, and the heat dissipation layer 116 may be electrically grounded.

When the heat dissipation layer 116 is electrically connected to a part of the circuit board 190 and is electrically grounded, it is possible to reduce unnecessary electrical noise from being introduced into the ultrasonic fingerprint sensor 120.

For example, the heat dissipation layer 116 may be connected to a specific printed circuit board electrically connected to a pad disposed in the non-active area, and, for example, may be electrically grounded to a ground pad disposed on a specific printed circuit board.

The ultrasonic fingerprint sensor 120 is disposed in the first area A1 below the back plate 130. That is, the first area A1 may refer to an area overlapping with the display panel 140. The ultrasonic fingerprint sensor 120 is a device for sensing the shape of a fingerprint of a finger contacting an upper surface of the display device 100. Specifically, the cushion structure 110 is disposed in the second area A2, and the first area A1 in which the cushion structure 110 is not disposed may have an opening area. In this case, the ultrasonic fingerprint sensor 120 may be disposed in the opening area.

Specifically, the ultrasonic fingerprint sensor 120 may be an ultrasonic fingerprint sensor. The ultrasonic fingerprint sensor 120 may emit ultrasonic waves to the surface of the display device 100 and the ultrasonic waves may be reflected from the surface of the display device 100 with which the finger is touched. Accordingly, the ultrasonic fingerprint sensor 120 may sense the shape of the fingerprint by receiving the reflected ultrasonic waves. Specifically, an air layer may be formed on the surface of the display device 100 by the fingerprint of the finger. The reflectance of the ultrasonic waves may vary on the surface where the finger is touched and on the surface where the air layer is formed. The ultrasonic fingerprint sensor 120 may recognize the shape of the fingerprint according to a difference in amplitude of the ultrasonic waves reflected from the surface of the display device 100. The method of sensing the shape of the fingerprint using the ultrasonic waves by the ultrasonic fingerprint sensor 120 is not limited thereto.

The ultrasonic fingerprint sensor 120 is electrically connected to the circuit board 190 disposed below the ultrasonic fingerprint sensor 120. The circuit board 190 may be a flexible circuit board. The circuit board 190 is configured to transmit an electrical signal to a processor that controls the ultrasonic fingerprint sensor 120. The cushion structure 110 is configured to surround the ultrasonic fingerprint sensor 120. The ultrasonic fingerprint sensor 120 is attached to the circuit board 190. The circuit board 190 overlaps with the ultrasonic fingerprint sensor 120 and is further extended from the ultrasonic fingerprint sensor 120 to overlap with the cushion structure 110.

The display device 100 of the exemplary embodiment of the present disclosure is configured to include the flexible display panel 140, the ultrasonic fingerprint sensor 120 which is disposed below the rear surface of the flexible display panel 140 and has a first thickness T1 and a first width W1, the cushion structure 110 which is disposed below the rear surface of the flexible display panel 140, surrounds the periphery of the ultrasonic fingerprint sensor 120, and has a second thickness T2 larger than the first thickness T1, and the circuit board 190 which is electrically connected to the ultrasonic fingerprint sensor 120 and has a second width W2 larger than the first width W1. Here, the second thickness T2 refers to a thickness of the cushion structure 110 corresponding to the thickness of the opening area of the cushion structure 110.

Since the flexible display panel 140 has a flexible characteristic, the flexible display panel 140 may be deformed by the shape, stress, tension or pressure of the components attached to the rear surface. Accordingly, the thickness of the ultrasonic fingerprint sensor 120, for example, the first thickness T1 may be configured to be smaller than the thickness of the cushion structure 110, for example, the second thickness T2 so as to suppress the ultrasonic fingerprint sensor 120 from physically affecting the flexible display panel 140. When the ultrasonic fingerprint sensor 120 is mounted on the circuit board 190 and the circuit board 190 is supported by the cushion structure 110, the ultrasonic fingerprint sensor 120 is not brought into direct contact with the flexible display panel 140.

According to the above-described configuration, the ultrasonic fingerprint sensor 120 may be spaced apart from the rear surface of the flexible display panel 140 by a predetermined distance in a first direction. For example, the ultrasonic fingerprint sensor 120 may be spaced apart from the rear surface of the flexible display panel 140 in a vertical direction. Therefore, the unnecessary physical influence that may be applied to the flexible display panel 140 by the ultrasonic fingerprint sensor 120 may be minimized. Therefore, the deformation of the flexible display panel 140 may be minimized.

The width of the ultrasonic fingerprint sensor 120, for example, the first width W1 may be smaller than the width of the circuit board 190, for example, the second width W2, so that the circuit board 190 is supported by the cushion structure 110. That is, the area of the circuit board 190 may be larger than the area of the ultrasonic fingerprint sensor 120, and the circuit board 190 may be disposed below at least a part of the cushion structure 110. The area of the opening area where the ultrasonic fingerprint sensor 120 is accommodated may be smaller than the area of the circuit board 190.

According to the above-described configuration, the circuit board 190 may be supported by the cushion structure 110. In addition, since the ultrasonic fingerprint sensor 120 is fixed to the circuit board 190, the unnecessary physical influence that may be applied to the flexible display panel 140 may be minimized. Therefore, the deformation of the flexible display panel 140 may be minimized.

In addition, the back plate 130 may be further disposed between the flexible display panel 140 and the ultrasonic fingerprint sensor 120. In this case, the ultrasonic fingerprint sensor 120 may adhere to the back plate 130, and the cushion structure 110 may adhere to the back plate 130.

A third adhesive layer 121 may be disposed on the ultrasonic fingerprint sensor 120. The third adhesive layer 121 is an adhesive layer for attaching the ultrasonic fingerprint sensor 120 to the back plate 130.

The third adhesive layer 121 may be made of a thermosetting material. The thermosetting material is a material that is cured by heat and is disposed between the ultrasonic fingerprint sensor 120 and the flexible display panel 140 to be cured by heat, so that the ultrasonic fingerprint sensor 120 may be attached to the flexible display panel 140.

A curing temperature of the thermosetting material constituting the third adhesive layer 121 may be lower than a temperature at which the flexible display panel 140 is damaged. Specifically, the heat may also be applied to the flexible display panel 140 by a process of applying heat to the third adhesive layer 121 disposed between the ultrasonic fingerprint sensor 120 and the back plate 130. In this case, the display element constituting the flexible display panel 140, that is, the electroluminescent element may be damaged by heat. Accordingly, the third adhesive layer 121 may be made of a thermosetting material which is cured at a temperature lower than the temperature at which the flexible display panel 140 is damaged, i.e. at a temperature that minimizes the damage to the flexible display panel 140. For example, the third adhesive layer 121 may be made of a thermosetting material which is cured at 60° C. or less. Therefore, the display device 100 according to the exemplary embodiment of the present disclosure is formed of the thermosetting material that is cured at a temperature lower than the temperature at which the flexible display panel 140 is damaged, thereby minimizing damage to the flexible display panel 140 and adhering the ultrasonic fingerprint sensor 120 and the flexible display panel 140 or the back plate 130 disposed below the rear surface of the flexible display panel 140 and the ultrasonic fingerprint sensor 120 to each other.

Meanwhile, first, the ultrasonic fingerprint sensor 120 is fixed to the circuit board 190, the cushion structure 110 is fixed to the flexible display panel 140, and then the ultrasonic fingerprint sensor 120 may be fixed to the flexible display panel 140 by the third adhesive layer 121 while being supported by the cushion structure 110 supported by the circuit board 190. At this time, the ultrasonic fingerprint sensor 120 may be fixed while being spaced apart by at least 3 µm from the rear surface of the flexible display panel 140. That is, the thickness of the third adhesive layer 121 after heat curing may be at least 3 µm or more. Thereafter, the third adhesive layer 121 may be thermally cured. A thermosetting adhesive has a characteristic that the shape may be easily deformed before curing. Accordingly, if a predetermined gap is provided between the fingerprint sensor 120 and the flexible display panel 140, the thermosetting adhesive may fill the gap and may not provide unnecessary stress. According to the above-described configuration, the third adhesive layer 121 fill a predetermined gap before being thermally cured. Since the third adhesive layer 121 is not thermally cured, the third adhesive layer 121 may not apply unnecessary stress to the flexible display panel 140. Therefore, it is possible to minimize the occurrence of deformation in the flexible display panel 140.

In addition, when the thickness of the third adhesive layer 121 is increased to 500 µm or more, the ultrasonic signal may be reduced. Accordingly, when the thickness of the third adhesive layer 121 is 500 µm or less, the ultrasonic signal level may be improved. However, the present disclosure is not limited thereto.

The third adhesive layer 121 may be made of a material having a Young's modulus of 1 Gpa or more after heat curing. The Young's modulus is the modulus of elasticity that indicates the extent to which an object is stretched or deformed when both ends of the object are stretched. That is, the Young's modulus may mean the ability of a material subjected to longitudinal tension or compressive force to withstand a length change.

For example, when the flexible display panel 140 and the ultrasonic fingerprint sensor 120 are adhered to each other using an adhesive layer made of a photo-curable material, the adhesive layer may not be sufficiently cured. This is because a space in which the ultrasonic fingerprint sensor 120 is accommodated may be shielded by the circuit board 190. Accordingly, the adhesive layer made of the photo-curable material may not be cured.

For example, when the flexible display panel 140 and the ultrasonic fingerprint sensor 120 adhere to each other using an adhesive layer made of a material which is cured by pressure, the display device 100 may be damaged. In the case of the material which is cured by pressure, the material may be cured when a force above predetermined pressure is applied. However, when a force equal to or higher than pressure capable of causing curing is applied, deformation or damage may occur in configurations such as the flexible display panel or the like on the adhesive layer.

In the display device according to the exemplary embodiment of the present disclosure, the third adhesive layer 121 made of a thermosetting material adheres the ultrasonic fingerprint sensor 120 and the flexible display panel 140 to each other, thereby attaching the ultrasonic fingerprint sensor 120 without the damage to the flexible display panel 140.

In the display device 100 according to the exemplary embodiment of the present disclosure, the third adhesive layer 121 is formed of a material having a Young's modulus of 1 Gpa or more, so that the third adhesive layer 121 may be made of a material having a minimum Young's modulus difference from a layer disposed on the third adhesive layer 121. Specifically, when a difference in Young's modulus value between two media disposed in sequence is minimized, compared with the case where the difference in Young's modulus value between two media is not minimized, the amount of ultrasonic waves which are reflected without entering another medium among the ultrasonic waves incident to another medium from one medium may be reduced. That is, when the difference in Young's modulus value between two media is not minimized, the ultrasonic waves incident to one medium may not be efficiently incident to another medium, but may be mostly reflected. Accordingly, by reducing the difference in Young's modulus value between the two media, the reflectance of the ultrasonic waves is reduced at the boundary between the media when the ultrasonic waves are incident from one medium to another medium, and the transmittance to the another medium may be increased. For example, the back plate 130 may be disposed on the third adhesive layer 121, and the third adhesive layer 121 may be formed of a material in which a difference in Young's modulus from the back plate 130 may be minimized. In addition, a general adhesive layer is viscous and has a Young's modulus of 1 GPa or less. On the other hand, since the third adhesive layer 121 is made of a material having a Young's modulus of 1 Gpa or more, the Young's modulus difference from the back plate 130 may be reduced.

As a result, in the ultrasonic waves emitted from the ultrasonic fingerprint sensor 120 to be incident to the third adhesive layer 121, the ultrasonic waves which are not incident to the back plate 130 but reflected at the boundary between the third adhesive layer 121 and the back plate 130 may be reduced. Accordingly, in the display device 100 according to the exemplary embodiment of the present disclosure, the ultrasonic waves generated from the ultrasonic fingerprint sensor 120 may be easily transmitted through each layer of the display device 100.

In the display device 100 according to the exemplary embodiment of the present disclosure, the ultrasonic fingerprint sensor 120 is disposed below the active area AA of the flexible display panel 140, thereby reducing the width of the bezel. Specifically, as compared with the case where the ultrasonic fingerprint sensor 120 is disposed in the non-active area NA of the flexible display panel 140, as illustrated in FIGS. 1A and 1B, when the ultrasonic fingerprint sensor 120 is disposed below the active area AA of the flexible display panel 140, the ultrasonic fingerprint sensor 120 is not disposed in the non-active area NA, thereby minimizing the width of the bezel.

In the display device 100 according to the exemplary embodiment of the present disclosure, the shock absorbing layer 115 is not disposed on the ultrasonic fingerprint sensor 120, thereby effectively sensing the shape of the fingerprint. Specifically, if ultrasonic waves emitted from the ultrasonic fingerprint sensor 120 pass through the shock absorbing layer 115 disposed on the ultrasonic fingerprint sensor 120, signal distortion may occur. The shock absorbing layer 115 may include a plurality of bubbles, and when the ultrasonic waves pass through the shock absorbing layer 115, the signal distortion may occur due to the difference between a medium of the shock absorbing layer 115 and a medium of the plurality of bubbles. If the shock absorbing layer 115 is positioned on the ultrasonic fingerprint sensor 120, the ultrasonic waves emitted from the ultrasonic fingerprint sensor 120 may pass through the shock absorbing layer 115 while being reflected on the surface of the display device 100 and then received to the ultrasonic fingerprint sensor 120. Accordingly, the ultrasonic fingerprint sensor 120 may receive the ultrasonic waves in which the signal distortion occurs, and thus an error may occur in recognizing the shape of the fingerprint. Therefore, in the display device 100 according to the exemplary embodiment of the present disclosure, the shock absorbing layer 115 is not disposed on the ultrasonic fingerprint sensor 120 to suppress the signal distortion of the ultrasonic waves, thereby more accurately sensing the shape of the fingerprint.

According to some exemplary embodiments, a touch panel 150 may be further disposed on the flexible display panel 140. The touch panel 150 is an input device capable of directly inputting information by touching a screen with a finger or a pen. The touch panel 150 may be a capacitive type. Further, as illustrated in FIG. 1B, the touch panel 150 may be an add-on type that is manufactured independently of the flexible display panel 140 and then disposed on the flexible display panel 140, but is not limited thereto. The touch panel 150 may be an in cell type which is embedded in pixels included in the flexible display panel 140 or an on cell type which is formed on the flexible display panel 140. However, if a material such as gas or air exists between the touch panel 150 and the display panel 140, ultrasonic waves for sensing the fingerprint may be absorbed. Accordingly, materials required for transmitting the ultrasonic waves may be filled between the display panel 140 and the touch panel 150, and the material such as gas or air is not disposed between the display panel 140 and the touch panel 150. However, the present disclosure is not limited to the touch panel 150.

According to some exemplary embodiments, a polarizing plate 160 may be further disposed on the touch panel 150. The polarizing plate 160 refers to a layer capable of polarizing incident light. The polarizing plate 160 may suppress the visibility of the screen from being lowered due to reflection of external light. When the polarizing plate 160 is provided, a fourth adhesive layer 170 may be disposed on the polarizing plate 160. The fourth adhesive layer 170 is an adhesive layer for adhering the polarizing plate 160 and a cover 180. The fourth adhesive layer 170 may be made of an optically clear adhesive (OCA) or a pressure sensitive adhesive (PSA). The cover 180 may be disposed on the fourth adhesive layer 170. The cover 180 is a configuration which is disposed on the display device 100 to protect the display device 100. The cover 180 may be formed of, for example, reinforced plastic or reinforced glass. However, the present disclosure is not limited to the polarizing plate 160.

Figure 2:
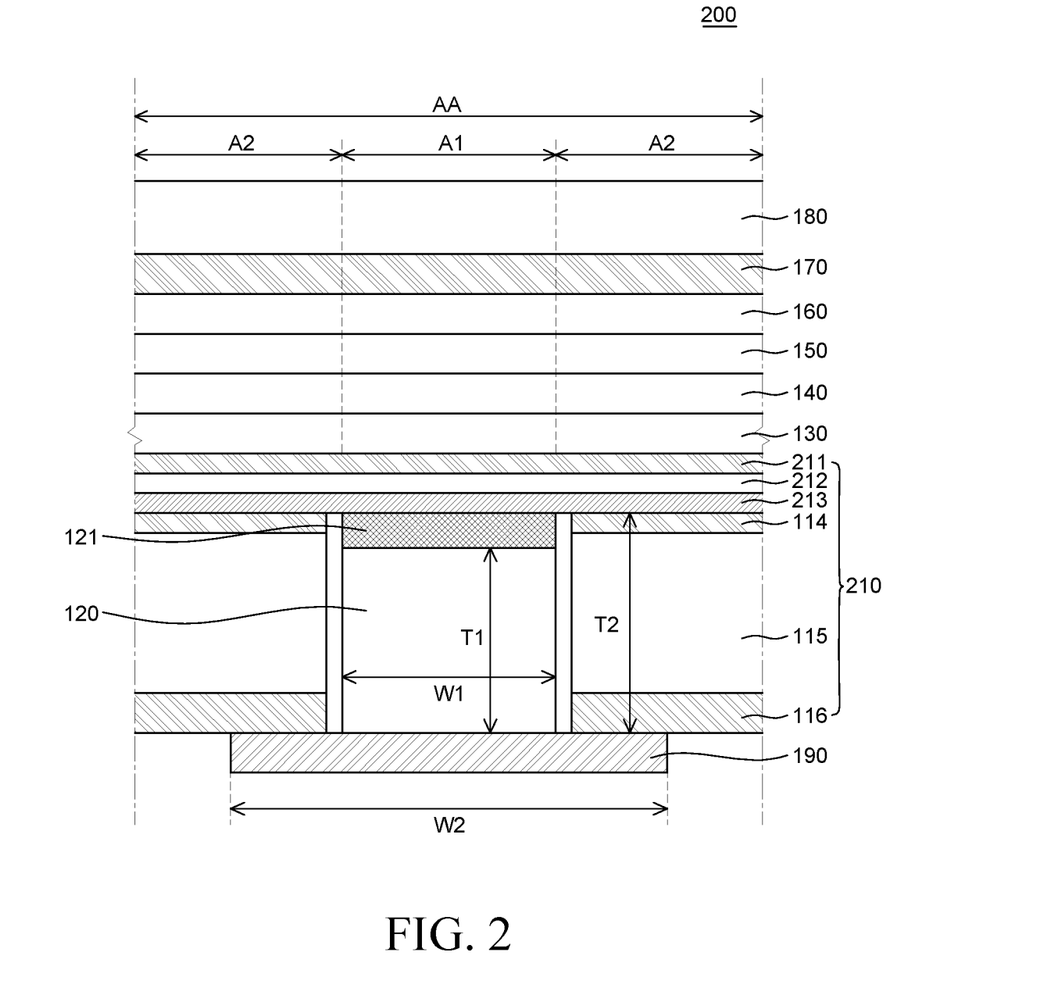
FIG. 2 is a cross-sectional view of a display device according to another exemplary embodiment of the present disclosure.

FIG. 2 is a cross-sectional view of a display device according to another exemplary embodiment of the present disclosure. A display device 200 of FIG. 2 is substantially the same as the display device 100 of FIG. 1 except that there is a difference in a cushion structure 210, and duplicated description will be omitted.

Referring to FIG. 2, a first adhesive layer 211, a support layer 212, and a black layer 213 may also be disposed in a first area A1. Specifically, the first adhesive layer 211, the support layer 212, and the black layer 213 may be disposed in both the first area A1 and a second area A2. Accordingly, the ultrasonic fingerprint sensor 120 and the third adhesive layer 121 may be disposed below the black layer 213.

A second thickness T2 of the cushion structure 210 means a thickness of at least a part of the cushion structure 210 corresponding to the thickness of an opening area of the cushion structure 210. That is, the second thickness T2 may be a thickness of the cushion structure 210 except for a thickness of the components positioned in the first area A1 and the second area A2, such as the first adhesive layer 211, the support layer 212, and the black layer 213.

The display device 200 according to another exemplary embodiment of the present disclosure is configured to reduce light passing through the rear surface of the flexible display panel 140. For example, the cushion structure 210 disposed below the rear surface of the flexible display panel 140 is configured to include an opening area where the ultrasonic fingerprint sensor 120 may be disposed, and the cushion structure 210 is configured to reduce visible light incident to the rear surface of the flexible display panel 140 through the opening area. The cushion structure 210 may be disposed adjacent the ultrasonic fingerprint sensor 120 in a second direction different from the first direction. For example, the cushion structure 210 may be disposed adjacent the ultrasonic fingerprint sensor 120 in a horizontal direction.

In other words, the circuit board 190 supported by the cushion structure 210 may be configured to cover the opening area so as to reduce the visible light incident to the rear surface of the flexible display panel 140 through the opening area. The visible light transmittance of the circuit board 190 may be at least 50% or more. However, the present disclosure is not limited thereto.

According to the above-described configuration, the circuit board 190 is configured to have a predetermined visible light absorption rate, the circuit board 190 is configured to cover the opening area, and the circuit board 190 is supported by the cushion structure 210, thereby reducing light incident to the opening area of the cushion structure 210 while minimizing the deformation of the flexible display panel 140.

In the display device 200 according to another exemplary embodiment of the present disclosure, since the first adhesive layer 211, the support layer 212, and the black layer 213 may be disposed even in the first area A1, deformation or damage to the flexible display panel 140 may be minimized. Specifically, a separation space may exist between the ultrasonic fingerprint sensor 120 and the third adhesive layer 121 and the cushion structure 210. The process of forming the ultrasonic fingerprint sensor 120 below the flexible display panel 140 may be performed by removing a part of the cushion structure 210 corresponding to the first area A1 and adhering the ultrasonic fingerprint sensor 120 to the first area A1 where the part of the cushion structure 210 is removed using the third adhesive layer 121. Accordingly, a separation space may exist between the ultrasonic fingerprint sensor 120 and the third adhesive layer 121 and the cushion structure 210. For example, the ultrasonic fingerprint sensor 120 may be spaced apart from at least a part of the cushion structure 210 in the second direction (e.g., horizontal direction) to create a separation space between the ultrasonic fingerprint sensor 120 and the part of the cushion structure 210. In this case, the visible light may be incident into the display device 200 by the separation space between the ultrasonic fingerprint sensor 120 and the third adhesive layer 121 and the cushion structure 210. If the visible light is incident to the flexible display panel 140, damage to the flexible display panel 140 such as a shadow mura may occur. In this case, the visible light may be suppressed from reaching the flexible display panel 140 by the black layer 213 existing between the ultrasonic fingerprint sensor 120 and the flexible display panel 140. Accordingly, the black layer 213 is formed over the first area A1 and the second area A2, so that the visible light incident to the separation space between the ultrasonic fingerprint sensor 120 and the cushion structure 210 may not be transmitted to the flexible display panel 140. Thus, at least another part of the cushion structure 210 (e.g., a part of the black layer 213) may be disposed on a top surface of the ultrasonic fingerprint sensor 120 and cover the separation space. Therefore, the damage to the flexible display panel 140 may be reduced.

Figure 3:
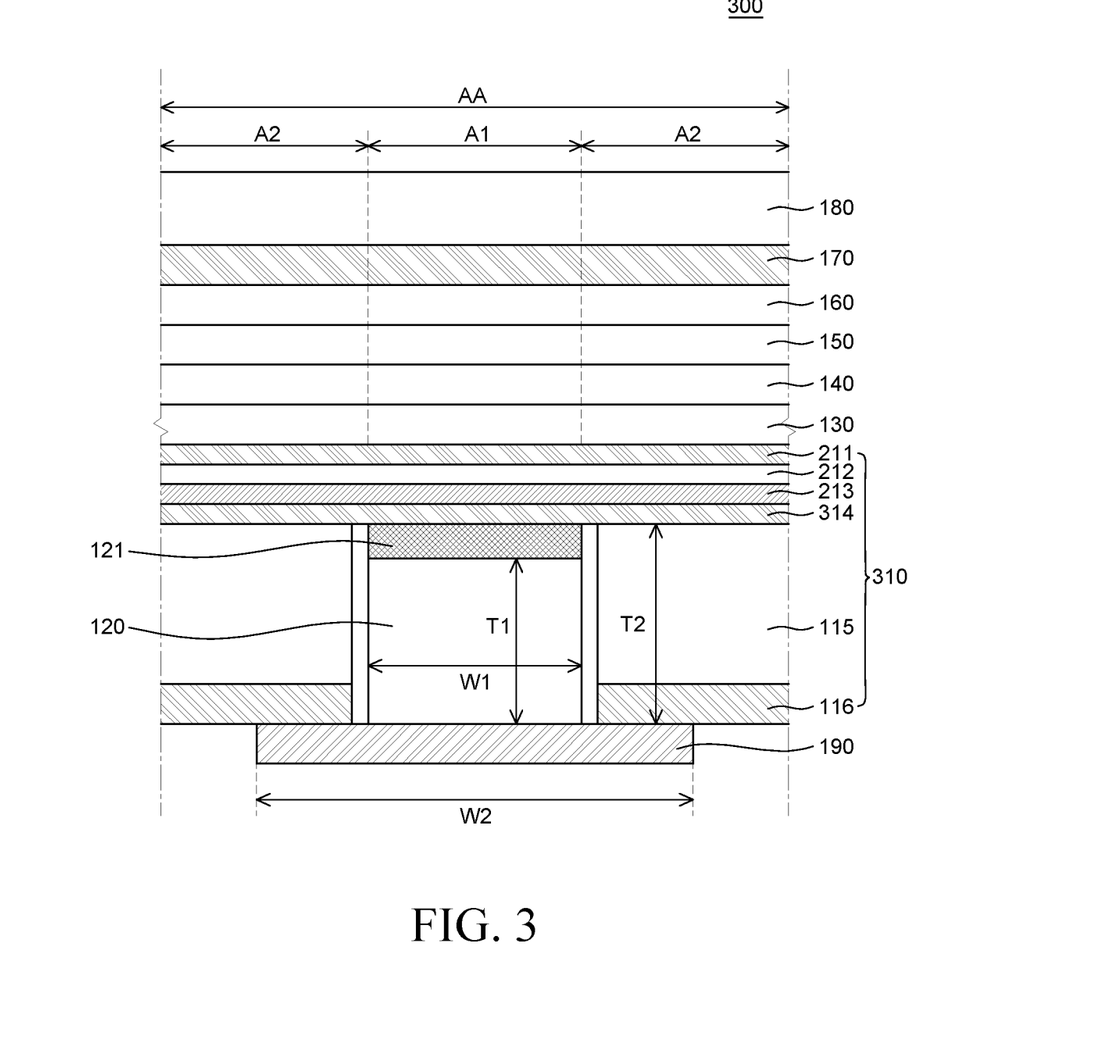
FIG. 3 is a cross-sectional view of a display device according to yet another exemplary embodiment of the present disclosure.

FIG. 3 is a cross-sectional view of a display device according to yet another exemplary embodiment of the present disclosure. A display device 300 of FIG. 3 is substantially the same as the display device 200 of FIG. 2 except that there is a difference in a cushion structure 310, and duplicated description will be omitted.

Referring to FIG. 3, a second adhesive layer 314 is also disposed in the first area A1. Specifically, the second adhesive layer 314 is disposed in both the first area A1 and the second area A2. Accordingly, the ultrasonic fingerprint sensor 120 is disposed below the second adhesive layer 314.

In this case, unlike that illustrated in FIG. 3, the third adhesive layer 121 may also be removed. The third adhesive layer 121 disposed on the ultrasonic fingerprint sensor 120 may be removed and the second adhesive layer 314 may be disposed on the ultrasonic fingerprint sensor 120. Accordingly, the ultrasonic fingerprint sensor 120 may be adhered by the second adhesive layer 314.

A second thickness T2 of the cushion structure 310 means a thickness of at least a part of the cushion structure 310 corresponding to a thickness of an opening area of the cushion structure 310. That is, the second thickness T2 may be a thickness of the cushion structure 310 except for a thickness of the components positioned simultaneously in the first area A1 and the second area A2, such as the first adhesive layer 211, the support layer 212, the black layer 213, and the second adhesive layer 314.

In this case, the second adhesive layer 314 may have properties of the third adhesive layer 121 described in FIGS. 1 and 2. That is, the second adhesive layer 314 may be made of a thermosetting material. Further, the second adhesive layer 314 may be cured at a temperature lower than a temperature at which the flexible display panel 140 is damaged. For example, the second adhesive layer 314 may be cured at 60° C.

In the display device 300 according to yet another exemplary embodiment of the present disclosure, the second adhesive layer 314 may be made of the thermosetting material, so that the ultrasonic fingerprint sensor 120 may be adhered while the damage to the display device 300 is minimized. Further, the second adhesive layer 314 may be made of a material having a Young's modulus of 1 Gpa or more.

In the display device 300 according to yet another exemplary embodiment of the present disclosure, the cushion structure 310 includes at least a thermosetting adhesive layer 314 and a shock absorbing layer 115 disposed below the rear surface of the thermosetting adhesive layer 314. In addition, the shock absorbing layer 115 includes an opening area configured in which the ultrasonic fingerprint sensor 120 is disposed, and the thermosetting adhesive layer 314 overlaps with the shock absorbing layer 115 and is disposed in the opening area to adhere the ultrasonic fingerprint sensor 120.

In the display device 300 according to yet another exemplary embodiment of the present disclosure, the second adhesive layer 314 is made of a material having a Young's modulus of 1 Gpa or more, so that the second adhesive layer 314 may be made of a material having a reduced Young's modulus difference from the black layer 213 disposed on the second adhesive layer 314. Thus, the reflectance of the ultrasonic waves between the media may be reduced. Accordingly, the ultrasonic fingerprint sensor 120 may more effectively sense the shape of the fingerprint.

In addition, in the display device 300 according to yet another exemplary embodiment of the present disclosure, the third adhesive layer 121 is removed and the ultrasonic fingerprint sensor 120 is disposed below the second adhesive layer 314, so that the thickness of the display device 300 is reduced, and the ultrasonic waves may be more effectively transmitted. Specifically, when the second adhesive layer 314 is disposed in the first area A1, the ultrasonic fingerprint sensor 120 may be attached to the lower portion of the black layer 213 by the second adhesive layer 314 even if the third adhesive layer 121 is not present. Therefore, since the third adhesive layer 121 is not present, the thickness of the display device 300 may be reduced. In addition, the ultrasonic waves emitted from the ultrasonic fingerprint sensor 120 do not pass through the third adhesive layer 121, so that the distortion of the ultrasonic waves may be reduced. Since the ultrasonic waves may not pass through the third adhesive layer 121 due to the absence of the third adhesive layer 121, the ultrasonic waves may pass through few layers until being reflected from the upper surface of the display device 300 and returned to the ultrasonic fingerprint sensor 120 again. Accordingly, the ultrasonic fingerprint sensor 120 may more accurately sense the shape of the fingerprint.

Figure 4:
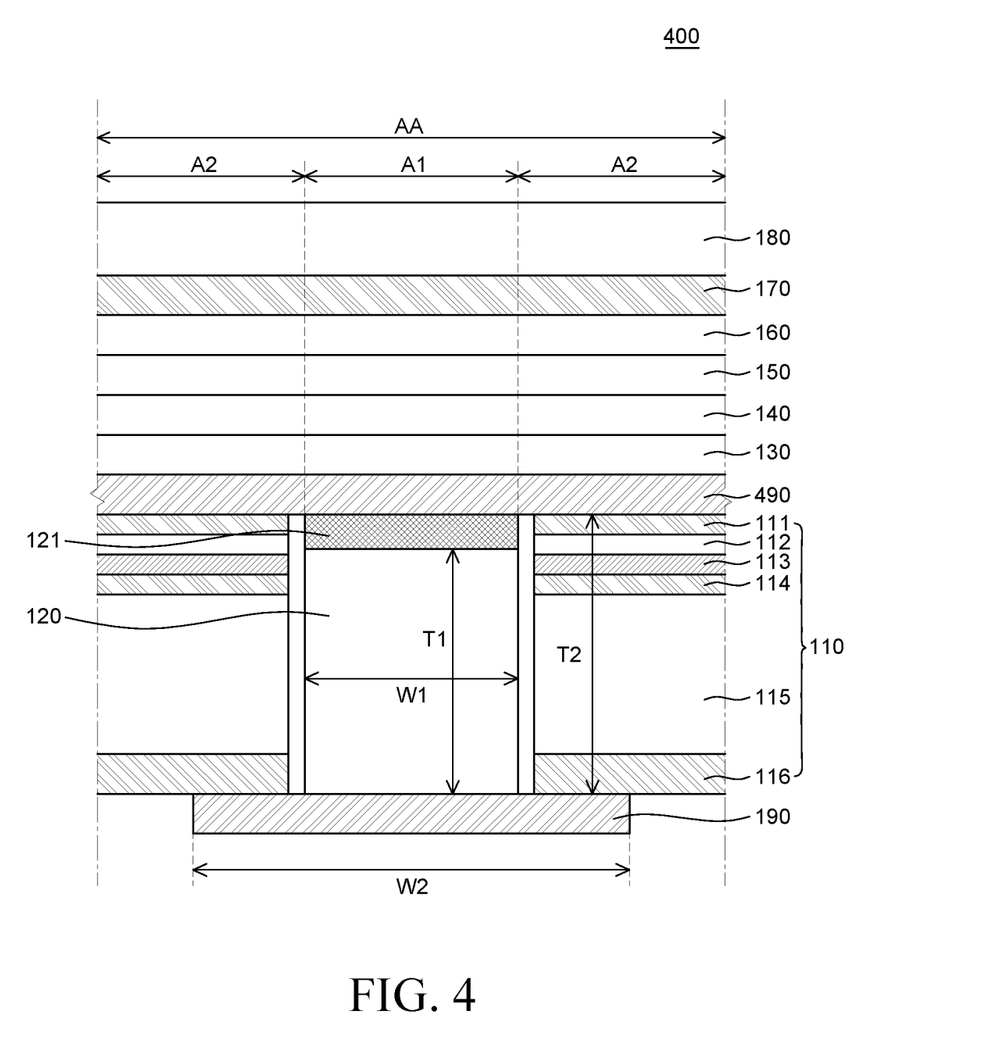
FIG. 4 is a cross-sectional view of a display device according to still another exemplary embodiment of the present disclosure.

FIG. 4 is a cross-sectional view of a display device according to still another exemplary embodiment of the present disclosure. A display device 400 of FIG. 4 is substantially the same as the display device 100 of FIG. 1 except that a metal layer 490 is further included, and duplicated description will be omitted.

Referring to FIG. 4, the metal layer 490 is disposed between the cushion structure 110 and the ultrasonic fingerprint sensor 120 and the flexible display panel 140. The metal layer 490 is a layer made of metal and functions as a shielding layer for shielding interference of signals. Specifically, the metal layers 490 may be disposed on the third adhesive layer 121 of the first area A1 and the cushion structure 110 of the second area A2 and disposed below the back plate 130 to be formed in both the first area A1 and the second area A2. The metal layer 490 may be made of, for example, copper (Cu), aluminum (Al), silver (Ag), or the like.

In addition, the metal layer 490 may be grounded. Specifically, the metal layer 490 may be connected to a printed circuit board electrically connected to a pad disposed in the non-active area, and, for example, may be connected and grounded to a ground pad disposed on a specific printed circuit board. In addition, the metal layer 490 may be electrically connected to the heat dissipation layer 116.

The metal layer 490 may function as a shielding layer for blocking interference between a signal generated from the flexible display panel 140 and a signal generated from the ultrasonic fingerprint sensor 120. Specifically, in the flexible display panel 140, the signal may be generated by a display element and lines disposed in the flexible display panel 140. In addition, in the ultrasonic fingerprint sensor 120, ultrasonic waves may be emitted. In this case, the signal generated from the flexible display panel 140 and the signal generated from the ultrasonic fingerprint sensor 120 may be interfered with each other. When the ultrasonic waves emitted from the ultrasonic fingerprint sensor 120 are interfered with the signal generated from the flexible display panel 140, the ultrasonic fingerprint sensor 120 may not properly sense the shape of the fingerprint. Therefore, in the display device 400 according to still another exemplary embodiment of the present disclosure, the metal layer 490 which performs the function as the shielding layer for blocking interference between the signals is disposed between the cushion structure 110 and the ultrasonic fingerprint sensor 120 and the flexible display panel 140, so that the ultrasonic fingerprint sensor 120 may effectively sense the shape of the fingerprint without the interference between the signals.

The exemplary embodiments of the present disclosure can also be described as follows:

According to an aspect of the present disclosure, the display device may include: a flexible display panel; an ultrasonic fingerprint sensor which is disposed below a rear surface of an active area of the flexible display panel and has a first thickness and a first width; a cushion structure which is disposed below the rear surface of the flexible display panel, surrounds the periphery of the ultrasonic fingerprint sensor, and has a second thickness larger than the first thickness; and a circuit board which is electrically connected to the ultrasonic fingerprint sensor and has a second width larger than the first width.

According to an aspect of the present disclosure, a thickness of the ultrasonic fingerprint sensor may be smaller than a thickness of the cushion structure in order to minimize deformation of the flexible display panel.

According to an aspect of the present disclosure, the ultrasonic fingerprint sensor may be spaced apart from the rear surface of the flexible display panel by a predetermined distance.

According to another aspect of the present disclosure, an area of the circuit board may be larger than an area of the ultrasonic fingerprint sensor.

According to another aspect of the present disclosure, the circuit board may be configured to be supported by the cushion structure, and the ultrasonic fingerprint sensor is fixed to the circuit board.

According to another aspect of the present disclosure, the cushion structure may include at least one of a black layer, a shock absorbing layer, and a heat dissipation layer.

According to another aspect of the present disclosure, the display device may further include a thermosetting adhesive layer disposed between the ultrasonic fingerprint sensor and the flexible display panel.

According to another aspect of the present disclosure, a thickness of the thermosetting adhesive layer may be at least 3 µm or more after heat curing.

According to another aspect of the present disclosure, the display device may further include a black layer disposed between the flexible display panel and the ultrasonic fingerprint sensor.

According to another aspect of the present disclosure, the cushion structure may be configured to include an opening area in which the ultrasonic fingerprint sensor is disposed, and the cushion structure may be configured to reduce visible light incident to the rear surface of the flexible display panel through the opening area.

According to another aspect of the present disclosure, the circuit board supported by the cushion structure may be configured to cover the opening area, and the circuit board may be configured to reduce visible light incident to the rear surface of the flexible display panel through the opening area.

According to another aspect of the present disclosure, the cushion structure may include a thermosetting adhesive layer and a shock absorbing layer disposed below the rear surface of the thermosetting adhesive layer, the shock absorbing layer may include an opening area configured in which the ultrasonic fingerprint sensor is disposed, and the thermosetting adhesive layer may overlap with the shock absorbing layer and be disposed on the opening area to adhere the ultrasonic fingerprint sensor.

According to another aspect of the present disclosure, the cushion structure may include a heat dissipation layer, and the heat dissipation layer may contact with the circuit board.

According to another aspect of the present disclosure, the heat dissipation layer may be electrically connected to at least a part of the circuit board.

According to another aspect of the present disclosure, the heat dissipation layer may be electrically grounded.

According to another aspect of the present disclosure, the display device may further include a shielding layer disposed between the cushion structure and the ultrasonic fingerprint sensor and the flexible display panel and configured to block interference between a signal generated from the flexible display panel and a signal generated from the ultrasonic fingerprint sensor.

According to another aspect of the present disclosure, the shielding layer may be electrically connected to the heat dissipation layer.

According to exemplary embodiments of the present disclosure, the display device may include: a flexible display panel including an active area including a first area and a second area excluding the first area and a non-active area; an ultrasonic fingerprint sensor disposed in the first area below the flexible display panel; and a cushion structure disposed in the second area below the flexible display panel and including at least one of a black layer, a shock absorbing layer, and a heat dissipation layer.

According to another aspect of the present disclosure, the display device may further include a circuit board configured to fix the ultrasonic fingerprint sensor and supported by the cushion structure.

According to another aspect of the present disclosure, the circuit board may be configured to shield the first area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a flexible display panel including an active area for emitting light;
    an ultrasonic fingerprint sensor disposed below the active area of the flexible display panel, the ultrasonic fingerprint sensor spaced apart from a rear surface of the flexible display panel in a first direction;
    a cushion structure disposed below the flexible display panel, and disposed adjacent the ultrasonic fingerprint sensor in a second direction different from the first direction; and
    a circuit board electrically connected to the ultrasonic fingerprint sensor, wherein the cushion structure includes a heat dissipation layer; and wherein the circuit board contacts and is electrically connected with the heat dissipation layer.

2. The display device of claim 1,
    wherein the flexible display panel has a first thickness along the first direction and a first width along the second direction, wherein the circuit board has a second width along the second direction larger than the first width.

3. The display device of claim 1,
    wherein an area of the circuit board is larger than an area of the ultrasonic fingerprint sensor, and wherein the circuit board is disposed below at least a part of the cushion structure.

4. The display device of claim 1,
    wherein the ultrasonic fingerprint sensor is mounted to the circuit board such that the ultrasonic fingerprint sensor does not directly contact the flexible display panel.

5. The display device of claim 1,
    further comprising:
    an adhesive layer disposed between the ultrasonic fingerprint sensor and the flexible display panel.

6. The display device of claim 5,
    wherein a thickness of the adhesive layer along the first direction is 3 µm or more.

7. The display device of claim 1,
    wherein the ultrasonic fingerprint sensor is spaced apart from at least a part of the cushion structure in the second direction to provide a separation space between the ultrasonic fingerprint sensor and the part of the cushion structure.

8. The display device of claim 7, wherein at least another part of the cushion structure is disposed on a top surface of the ultrasonic fingerprint sensor and covers the separation space.

9. The display device of claim 8, wherein the cushion structure includes a black layer disposed between the flexible display panel and the ultrasonic fingerprint sensor, and wherein at least a part of the black layer covers the separation space.

10. The display device of claim 7, wherein the circuit board is disposed below the ultrasonic fingerprint sensor, and covers the separation space from a rear surface of the ultrasonic fingerprint sensor.

11. The display device of claim 7, wherein the cushion structure includes a shock absorbing layer, and wherein at least a part of the shock absorbing layer is spaced apart from the ultrasonic fingerprint sensor.

12. The display device of claim 11, wherein the cushion structure further includes an adhesive layer disposed on the shock absorbing layer, wherein the adhesive layer overlaps with the shock absorbing layer and is disposed on the ultrasonic fingerprint sensor to adhere to the ultrasonic fingerprint sensor.

13. The display device of claim 1, wherein the heat dissipation layer is electrically grounded.

14. A display device, comprising:
a flexible display panel including an active area for emitting light;
an ultrasonic fingerprint sensor disposed below the active area of the flexible display panel, the ultrasonic fingerprint sensor spaced apart from a rear surface of the flexible display panel in a first direction;
a cushion structure disposed below the flexible display panel, and disposed adjacent the ultrasonic fingerprint sensor in a second direction different from the first direction;
a circuit board electrically connected to the ultrasonic fingerprint sensor; and
a shielding layer disposed between the ultrasonic fingerprint sensor and the flexible display panel, the shielding layer formed of metal and configured to block interference between a signal generated from the flexible display panel and a signal generated from the ultrasonic fingerprint sensor, wherein the cushion structure includes a heat dissipation layer; and wherein the circuit board contacts and is electrically connected with the heat dissipation layer.

15. The display device of claim 14, wherein the shielding layer is electrically connected to the heat dissipation layer.

16. A display device, comprising: a flexible display panel including an active area for emitting light;
an ultrasonic fingerprint sensor disposed below the active area of the flexible display panel;
a cushion structure disposed below the flexible display panel in a first direction, and disposed adjacent the ultrasonic fingerprint sensor in a second direction different from the first direction; and
a circuit board electrically connected to the ultrasonic fingerprint sensor, wherein the cushion structure includes a heat dissipation layer; and wherein the circuit board contacts and is electrically connected with the heat dissipation layer.

17. The display device of claim 16, wherein the cushion structure is formed with an opening area, and wherein the ultrasonic fingerprint sensor is disposed within the opening area of the cushion structure.

18. The display device of claim 17, wherein the circuit board is disposed below the ultrasonic fingerprint sensor and configured to cover the opening area from a rear surface of the ultrasonic fingerprint sensor.

* * * * *